(12) United States Patent
Ebeling et al.

(10) Patent No.: US 9,558,796 B2
(45) Date of Patent: Jan. 31, 2017

(54) SYSTEMS AND METHODS FOR MAINTAINING MEMORY ACCESS COHERENCY IN EMBEDDED MEMORY BLOCKS

(71) Applicant: Altera Corporation, San Jose, CA (US)

(72) Inventors: Carl Ebeling, Redwood City, CA (US); Pohrong Rita Chu, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 127 days.

(21) Appl. No.: 14/526,007

(22) Filed: Oct. 28, 2014

(65) Prior Publication Data

US 2016/0118089 A1    Apr. 28, 2016

(51) Int. Cl.
*G11C 7/10*      (2006.01)
*H03K 19/177*    (2006.01)

(52) U.S. Cl.
CPC ......... *G11C 7/1039* (2013.01); *H03K 19/1776* (2013.01); *H03K 19/17764* (2013.01); *G11C 7/1033* (2013.01)

(58) Field of Classification Search
CPC ... G11C 7/1033; G11C 7/1039; G06F 13/1642
See application file for complete search history.

(56) References Cited

U.S. PATENT DOCUMENTS

| 9,158,715 | B1* | 10/2015 | Bromberg | G06F 12/0853 |
| 2009/0150624 | A1* | 6/2009 | Resnick | G06F 9/3004 711/155 |
| 2014/0223111 | A1* | 8/2014 | Dinkjian | G06F 12/00 711/147 |

* cited by examiner

*Primary Examiner* — Edward Dudek, Jr.
(74) *Attorney, Agent, or Firm* — Fletcher Yoder, P.C.

(57) ABSTRACT

Enhanced memory circuits are described that maintain coherency between concurrent memory reads and writes in a pipelined memory architecture. The described memory circuits can maintain data coherency regardless of the amount of pipelining applied to the memory inputs and/or outputs. Moreover, these memory circuits may be implemented as dedicated hard circuits in a field programmable gate array (FPGA) or other programmable logic device (PLD), and can be supplemented with user-configurable logic to achieve coherency in a variety of applications.

22 Claims, 15 Drawing Sheets

SYSTEMS AND METHODS FOR MAINTAINING MEMORY ACCESS COHERENCY IN EMBEDDED MEMORY BLOCKS

BACKGROUND OF THE DISCLOSURE

This disclosure relates to a programmable integrated circuit, and particularly to embedded memory blocks in a programmable integrated circuit device—e.g., a field-programmable gate array (FPGA) or other programmable logic device (PLD). More particularly, this disclosure relates to an enhanced embedded memory block that maintains coherency between concurrent memory reads and writes.

It has become increasingly common to design PLDs to include embedded memory blocks in the form of dedicated hard memory blocks and/or out of soft configurable logic. Such embedded memory blocks may include a concentration of circuitry on a PLD that has been partly or fully hardwired to enable the storage and retrieval of data. Embedded memory blocks may be implemented using soft logic resources such as shift registers or configuration memory (CRAM) look-up table masks (LUT-masks). Embedded memories may also be available (or configurable) with varying sizes, widths, port-counts, and single vs. dual port and/or dual-clock read/write functionality.

Embedded memories store many different types of data and enable a variety of functions. For example, they are employed in a wide range of industrial, wireline, and wireless applications where they may be used for caching data or to maintain load/store tables for packet data, statistics, pointers, etc. Embedded memories are also often used as temporary first-in first-out (FIFO) storage between asynchronous sources and components that access and provide data at varying data widths and clock speeds.

Generally, to retrieve data from a memory, a read address and some control signals (e.g., a clock signal) are presented to the memory, and the stored data located at the specified read address is output one clock cycle later. For write transactions, a write address and write data along with related control signals are presented to the memory, and the write data is stored in the memory at the specified write address. For many existing devices, both transactions may be concurrent on separate ports.

In some applications, data read from memory ("read data") is pipelined for one or more clock cycles prior to being output. In these instances, the read address must be presented to the memory early so that the read data is available when expected, i.e., during the same clock cycle the read data would have been made available had there been no pipelining. This is necessary, for example, when a read-modify-write command is processed by a pipelined memory circuit—if the read data is not made available early, non-current read data will be modified and written back to the memory location. Presenting the read address early realigns the reads and writes so that the read data is output during the same clock cycle as the corresponding write data is committed to memory.

At the same time, however, presenting the read address to the memory early presents its own challenges. Data written to memory during one clock cycle usually only becomes available during the next clock cycle. Specifically, data written to memory must be committed by the end of a clock cycle in order for that data to be available for reading in the next clock cycle. Presenting the read address to the memory early may therefore result in non-current data being read from the specified memory location. In particular, the read data will not include any data written to the memory location during, or after, the clock cycle in which the read address is presented to the memory. The greater the amount of pipelining introduced into the memory, the more significant the problem.

SUMMARY OF THE DISCLOSURE

In accordance with embodiments of the present disclosure, an enhanced memory circuit is provided that maintains coherency between concurrent memory reads and writes. These memory circuits may maintain data coherency regardless of the amount of pipelining applied to the memory inputs and/or outputs. Moreover, these memory circuits may be implemented as dedicated hard circuits in an FPGA or other PLD to increase performance while reducing the design burden on the user.

In accordance with embodiments of the present disclosure, there is provided a memory circuit for maintaining memory access coherency. The memory circuit includes a number of registers, a memory, comparator circuitry, and selection circuitry. The registers are configured to store a read address, a first write address, and first input data during a first clock cycle, and a second write address and second input data during a second clock cycle. The memory is configured to read data from a memory location corresponding to the read address during the second clock cycle, and one or more of the aforementioned registers are configured to store the data read from the memory. The memory is also configured to write the first input data to a memory location corresponding to the first write address during the second clock cycle. Meanwhile, the comparator circuitry is configured to determine (e.g., during the second clock cycle) whether the read address is the same as the first write address or the second write address. The selection circuitry is configured to receive the data read from memory, the first data input, and the second data input, and to output one of the following three signals: (i) the second data input when the comparator circuitry determines that the read address is the same as the second write address, (ii) the first data input when the comparator circuitry determines that the read address is the same as the first write address but not the second write address, or (iii) the data read from memory when the comparator circuitry determines that the read address is not the same as the first write address or the second write address.

In accordance with additional embodiments of the present disclosure, the comparator circuitry includes a first comparator, a second comparator, and a logic gate. The first comparator is configured to generate, during the second clock cycle, an indication whether the read address is the same as the first write address. The second comparator is configured to generate, during the second clock cycle, an indication whether the read address is the same as the second write address. The logic gate is configured to receive those indications and to generate, during the second clock cycle, an indication whether the read address is the same as the first write address or the second write address.

In accordance with additional embodiments of the present disclosure, the selection circuitry includes a first multiplexer and a second multiplexer. The first multiplexer is configured to receive, during the third clock cycle, the first input data and the second input data, and to output, during the third clock cycle one of the following two signals: (i) the first input data when the read address is not the same as the second write address, or (ii) the second input data when the read address is the same as the second write address. The second multiplexer is configured to receive, during the third clock cycle, the data read from memory and the output of the first multiplexer, and to output, during the third clock cycle one of the following two signals: (i) the data read from memory when the read address is not the same as the first write address or the second write address, or (ii) the output of the first multiplexer when the read address is the same as the first write address or the second write address.

In accordance with additional embodiments of the present disclosure, the plurality of registers, the memory, the comparator circuitry, and the selection circuitry are all implemented in dedicated hard logic of a programmable logic device (e.g., an FPGA).

In accordance with some embodiments of the present disclosure, there is provided a system for maintaining memory access coherency. The system includes a memory circuit that contains at least a pipeline register, first and second multiplexers, and first and second comparators. The pipeline register is coupled to an input data register and is configured to store an output of the input data register. The first multiplexer is coupled to the input data register and the pipeline register, and is configured to provide one of the output of the input data register and an output of the pipeline register based on an output of the first comparator. The second multiplexer is coupled to the first multiplexer and a memory output register, and is configured to provide one of an output of the memory output register and an output of the first multiplexer based on outputs of the first comparator and the second comparator.

In accordance with additional embodiments of the present disclosure, the first comparator is coupled to a read address register and is configured to compare an output of the read address register to an incoming write address. The second comparator is coupled to the read address register and a write address register, and is configured to compare the output of the read address register to an output of the write address register. In accordance with still additional embodiments of the present disclosure, the memory circuit also includes two additional registers: a first comparator register coupled to the first comparator and configured to store the output of the first comparator, and a second comparator register coupled to the second comparator and configured to store the output of the second comparator.

In accordance with additional embodiments of the present disclosure, the system further includes a number of input pipeline registers and processing circuitry. These components may be implemented in soft logic of the FPGA. The input pipeline registers are coupled to the write address register and are configured to pipeline an input of the read address register, e.g., for two clock cycles. The processing circuitry is coupled to the memory circuit and is configured to process an output of the second multiplexer. The input data register is configured to receive an output of the processing circuitry.

Methods of configuring and operating the above-described memory circuits and programmable integrated circuit devices are also provided.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION OF THE INVENTION

In accordance with embodiments of the present disclosure, an enhanced memory circuit is provided that maintains coherency between concurrent memory reads and writes. These memory circuits may maintain data coherency regardless of the amount of pipelining applied to the memory inputs and/or outputs. Moreover, these memory circuits may be implemented as dedicated hard circuits in an FPGA or other PLD, e.g., to increase performance while reducing the design burden on the user.

The embedded memory circuits and functions described herein are agnostic of embedded memory type (e.g., SRAM, embedded DRAM, etc.), memory element capacity, latency, and bandwidth, number and type of memory interface ports or channels, command/address/read-write control protocol, interface signaling method (e.g., parallel or serial), and memory element physical integration topology (e.g., embedded single-die, 2.5D multi-die, 3D stacked TSV). It should be understood that while this disclosure illustrates functionality as applied to embedded memory elements within a FPGA device architecture, the mechanisms described herein are by no means limited to FPGAs and can be implemented in, or used in conjunction with, any programmable integrated circuit. In addition, the mechanisms described herein can also be used with non- or semi-programmable integrated circuits, including ASICs.

Figure 1A:
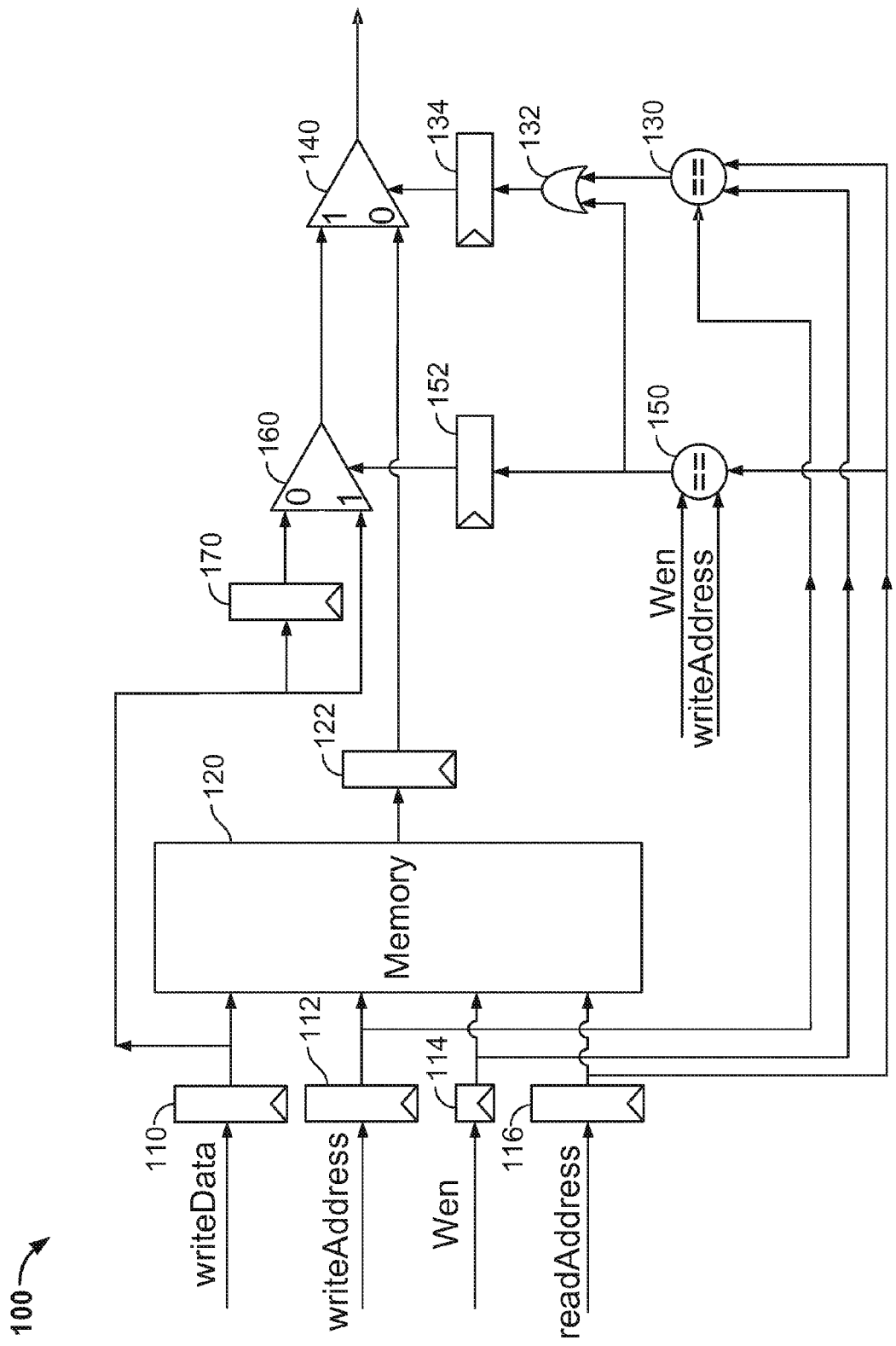
FIGS. 1A-1D are block diagrams of a memory circuit, according to illustrative embodiments.

FIG. 1A shows illustrative memory circuit 100 that maintains coherency in a 2-level pipelined memory, according to an illustrative embodiment. Memory circuit 100 includes input registers 110, 112, 114, 116; memory output register 122; and pipeline register 170. Memory circuit 100 also includes a memory 120; selection circuitry made up of (at least) multiplexers 140 and 160; as well as comparator circuitry made up of (at least) comparators 130 and 150, logic gate 132, and registers 134 and 152.

As shown, memory 120 is coupled to each of input registers 110, 112, 114, 116, which respectively provide the memory with input data, a write address, a write enable signal, and a read address. Memory 120, which is also coupled to output register 122, provides register 122 with data read from a memory location corresponding to a read address presented to the memory, e.g., during the same clock cycle. Register 110 is further coupled to pipeline register 170 and multiplexer 160 and provides each with the input data concurrently presented to the memory. Pipeline register 170 is likewise coupled to multiplexer 160 and provides multiplexer 160 with input data provided by register 110 during the previous clock cycle. Multiplexer 160, in turn, is coupled to multiplexer 140, the latter of which is further coupled to output register 122.

Thus, during any given clock cycle, multiplexer 160 receives once-pipelined input data from register 110 and twice-pipelined input data from register 170 and outputs one of the two based on a selection signal. During the same clock cycle, multiplexer 140 receives the data output by multiplexer 160 and data output by register 122 (i.e., once-pipelined data read from the memory) and outputs one of the two based on another selection signal. The two selection signals are generated by the comparator circuitry, which determines whether the incoming write address and/or a once-pipelined write address matches a once-pipelined read address.

The comparator circuitry includes comparator 130, coupled to logic gate 132, which compares a once-pipelined read address (output by register 116) to a once-pipelined write address (output by register 112) to determine whether the two addresses are the same. The comparator circuitry also includes comparator 150, coupled to logic gate 132 and register 152, which compares a once-pipelined read address (output by register 116) to the incoming write address to determine whether the two addresses are the same. The results of the two comparisons are provided to logic gate 132, which may be an OR gate. Concurrently, the result of the comparison performed by comparator 150 is provided to register 152, where it is pipelined for a clock cycle. Likewise, logic gate 132 provides an output signal to register 134, where it is pipelined for a clock cycle. The signal stored in register 134 is therefore an indication whether the once-pipelined read address is the same as the incoming write address, the once-pipelined write address, or both; and the signal stored in register 152 is an indication whether the once-pipelined read address is the same as the incoming write address.

During the next clock cycle, multiplexers 160 and 140 output one of the once-pipelined input data, twice-pipelined input data, and once-pipelined data read from the memory depending on the signals stored in registers 152 and 134, respectively. In particular, the once-pipelined input data is output when the comparator circuitry determines that the once-pipelined read address is the same as the incoming write address—i.e., the signal output by register 152 causes multiplexer 160 to output the data currently being provided by register 110, while the signal output by register 134 causes multiplexer 140 to output the data currently being provided by multiplexer 160. On the other hand, the twice-pipelined input data is output when the comparator circuitry determines that the once-pipelined read address is the same as the once-pipelined write address—i.e., the signal output by register 152 causes multiplexer 160 to output the data currently being provided by register 170, while the signal output by register 134 causes multiplexer 140 to output the data currently being provided by multiplexer 160. Finally, the once-pipelined data read from the memory is output when the comparator circuitry determines that the once-pipelined read address is neither the same as the once-pipelined write address nor as the incoming write address—i.e., the signal output by register 134 causes multiplexer 140 to output the data currently being provided by output register 122.

When a write enable signal is required by the memory, the comparator circuitry accounts for the write enable signals that accompany each of the incoming write address and once-pipelined write address. In particular, as shown, comparator 150 may indicate that the once-pipelined read address matches the incoming write address only when the incoming write enable signal is active. Similarly, comparator 130 may indicate that the once-pipelined read address matches the once-pipelined write address only when the once-pipelined write enable signal (stored in register 112) is active.

Figure 7A:
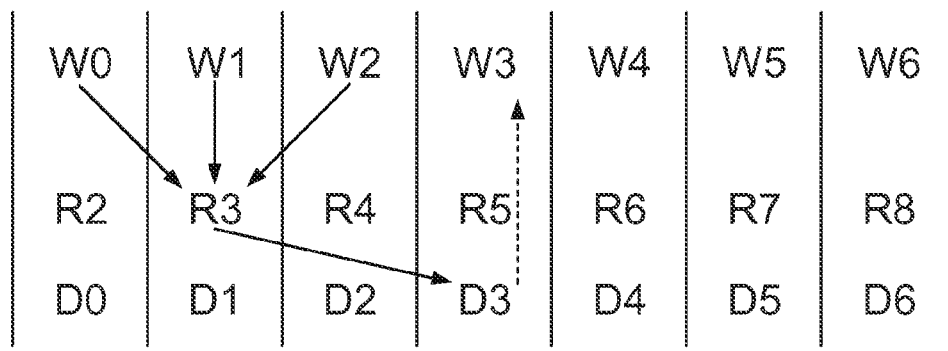
FIGS. 7A-7C depict illustrative timing diagrams of memory reads and writes, according to various illustrative embodiments.

An illustrative timing diagram corresponding to memory circuit 100 of FIG. 1A is provided in FIG. 7A. In FIG. 7A, each vertical line represents the end of one clock cycle and the beginning of the next. The notation W#, R#, and D# indicates the correspondence between reads, writes, and output data. Specifically, D# is the data returned by corresponding read R# and which must be made available prior to corresponding write W#. For example, D3 is the data corresponding to the read R3; W3 is a write that may rely on D3. In memories without pipelining, R3 and D3 would normally be performed during the same clock cycle. When pipelining is introduced, however, the read address must be presented to the memory early, i.e., the read must be moved up the same number of clock cycles as the level of pipelining.

When the read address is presented early, the memory must ensure that data written to the memory during the same clock cycle and in later clock cycles are available to the read operation as necessary. For example, a 2-level pipelined memory requires that a read address be presented two clock cycles in advance. As such, the write data presented during that same clock cycle and during the next clock cycle must be made available to the read. FIG. 1A achieves this functionality, as described above, by providing any one of three input data values depending on whether the read address matches the write address presented during the same clock cycle as the read address or the write address presented during the next clock cycle. This timing requirement is illustrated in FIG. 7A: when read R3 is presented, writes W1 and W2 are made available to R3 even though they are not yet committed to memory.

Although the foregoing discussion uses the example of a memory with 2 ports, where a read and a write can be performed concurrently, it should be understood that the same coherency mechanism is adaptable to a memory that has only one port, and only one read or write can be performed during each clock cycle. In this case the coherency logic is simpler since only one write can occur before the read data is output by the memory. Coherency also applies to memories with more than two ports, as long as the ports all operate on the same clock. These memories may provide the ability to perform more than two read/write operations per clock cycle. The coherency support described herein can be applied equally well to these multiport memories.

Figure 7B:
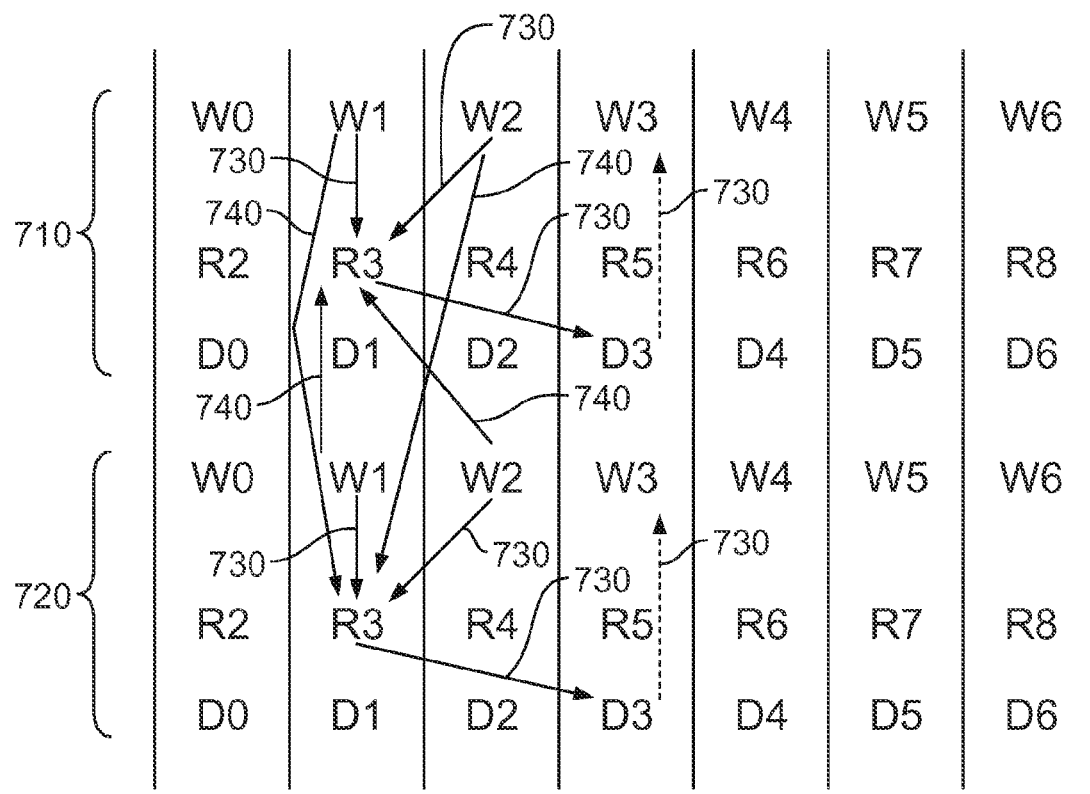

FIG. 7B shows the memory trace for a 4-ported memory with two read and two write ports. Arrows 730 show the data dependencies between write and read operations within each pair of ports 710 and 720. Arrows 740 show the additional data dependencies between the write and read operations across the two ports. Compared to the 2-port embodiments, each read access has two more dependencies to check. That is, four different writes may have occurred since the read was initiated that affect the read data output, and each of the four write addresses must be checked against the read address. In one arrangement, eight comparators are necessary to perform these comparisons, along with the multiplexers that select the appropriate write data values when read and write addresses match.

In some embodiments, when two writes are targeted to the same address concurrently, one write port is given priority over the other. This same priority designation is maintained for both read ports so that the memory reads return consistent data. Alternatively, in other embodiments, such simultaneous writes to the same address are deemed illegal, and the memory may write arbitrary data to the specified location.

In some embodiments, 4-ported memories are emulated by double-pumping a 2-ported memory, where each cycle is broken into 2 half-cycles, with one pair of read/writes done on the first half-cycle and the other pair on the second half-cycle. Since the writes are serialized, one port may be given static priority over the other, although dynamic priority is also possible if the write is re-ordered.

Figure 7C:
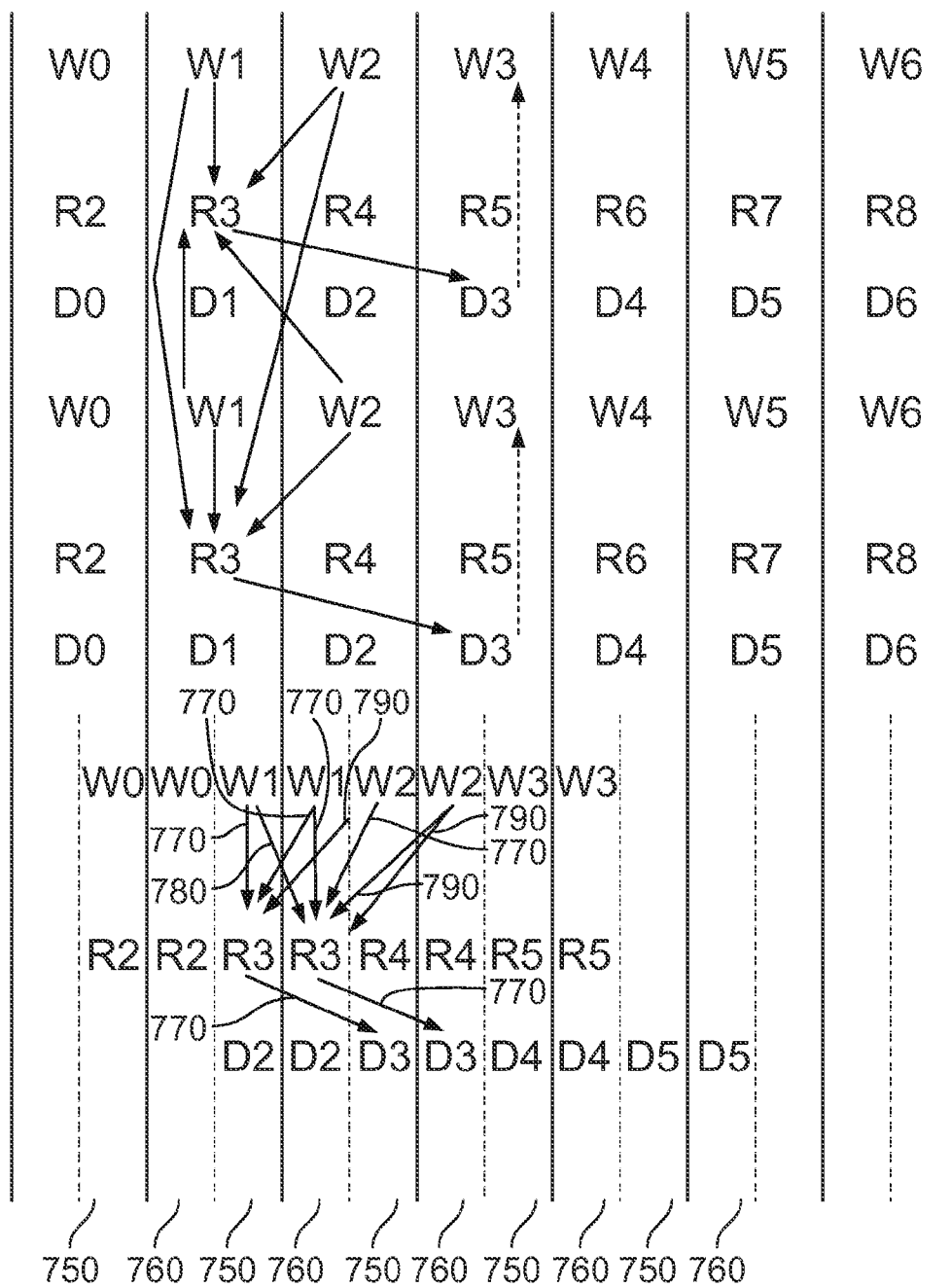

FIG. 7C shows a timing diagram for a coherent 2-ported memory emulating a 4-ported memory, where the dashed vertical lines delimit the 2× clock rate of the 2-ported memory. The first port's read and write inputs 760 must be delayed by one half-cycle with respect to the second port, and the second port's read data output 750 must be delayed by one half-cycle with respect to the first port. Arrows 770 show the data forwarding that the coherent 2-ported memory implements internally. Arrow 780 shows the data forwarding that occurs automatically because of the serialized reads and writes. Arrows 790 show the remaining three forwarding data paths that must be added to make the 4-ported memory coherent.

Referring back to FIG. 1A, registers 110-116 capture read and write addresses as well as data at the beginning of each clock cycle. The data read from memory is available at the end of the clock cycle and is captured in the output register 120. Additionally, the data being written to the memory is stored into the memory array by the end of the clock cycle. The two comparators 130 and 150 compare the read address with two different write addresses as described above. Specifically, with reference to FIG. 7A, comparator 130 performs the comparison of R3 with W1, while comparator 150 compares R3 with W2. If neither of these comparisons match, then the memory output is the data read from memory. If comparator 150 matches the write W2 with the read R3, then the data written by W2 is selected from register 110 by multiplexer 160 regardless of the result of comparator 130, since write W2 is more recent than W1. Otherwise, the data written by W1, stored in register 170, is selected for output.

It should be understood that memory circuit 100 is one realization of the coherency logic. Other arrangements of the registers and multiplexers are possible that implement the same functionality, and each arrangement may have different cost and delay characteristics. The selection of a particular arrangement may depend on, for example, the circuit technology used to implement the logic functions. Examples of some possible implementations appear in FIGS. 1B-1D, described below.

If the read and either of the two write addresses are the same, the data read by the memory is a "don't care" because it will be replaced at the output by the data being written. This characteristic may remove a constraint on the memory design that increases performance. For instance, the memory design may cause the read data to be unpredictable if a read and write occur simultaneously to the same address. The coherency mechanism described herein alleviates designers form having to deal with such unpredictable outputs.

The logic function performed by the circuit of FIG. 1A may be expressed by the following equation:

if ($WenN{+}1$ && WriteAddr$N{+}1{==}$ReadAddr$N$)

then ReadData$N{=}$WriteData$N{+}1$ elseif ($WenN$ && WriteAddr$N{==}$ReadAddr$N$)

then ReadData$N{=}$WriteData$N$ else ReadData$N{=}$MemoryData$N$ where N denotes the value of the signal at clock cycle N, and N+1 denotes the value of the signal at clock cycle N+1, that is, the cycle after N. It should be understood that while ReadDataN is the value associated with ReadAddrN, it becomes available at the output of the memory circuit on cycle N+2 since the memory has two levels of pipelining.

Figure 1B:
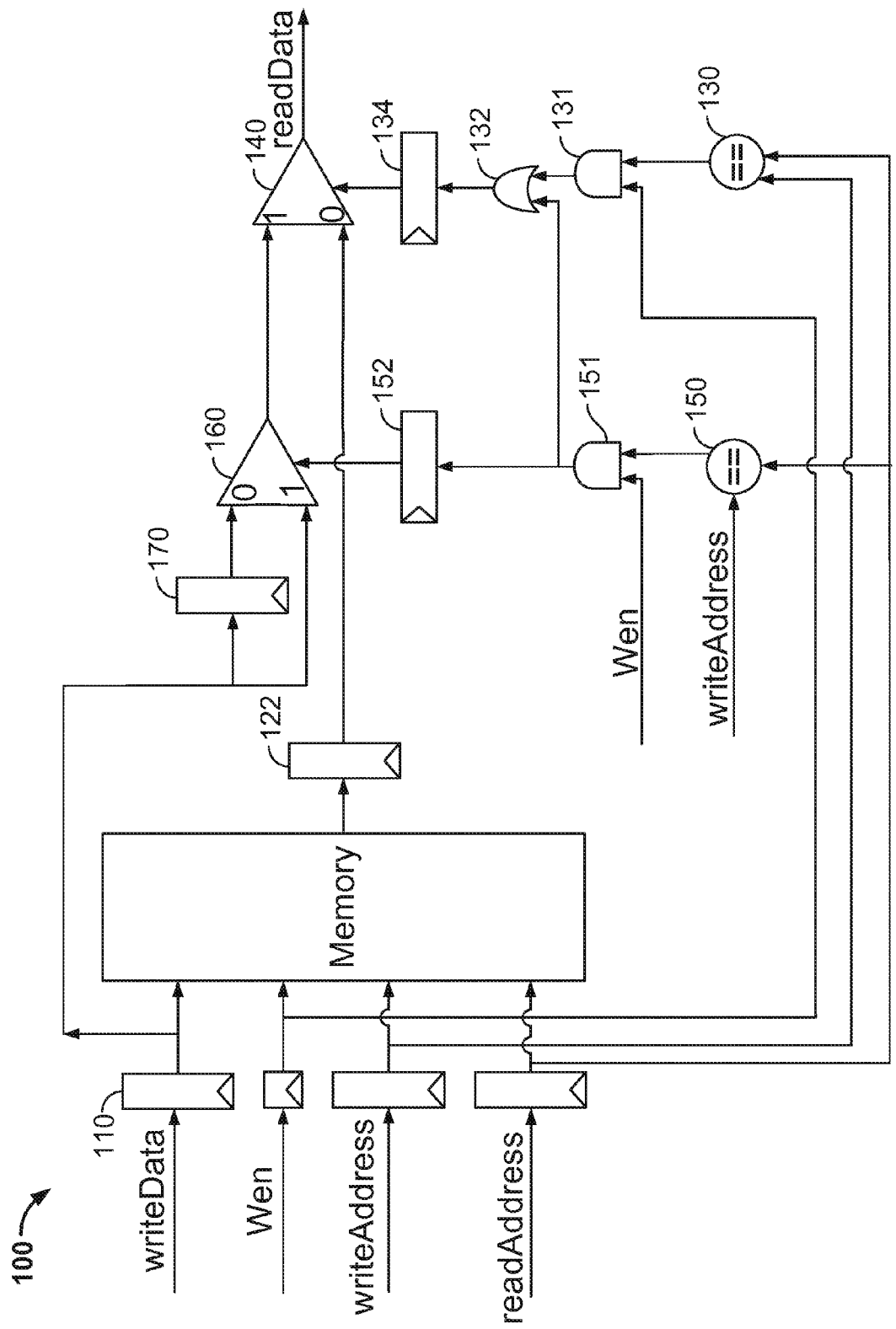

FIG. 1B shows illustrative memory circuit 100 of FIG. 1A with additional logic implemented in the forwarding circuit, according to an illustrative embodiment. In particular, FIG. 1B shows one approach to processing the write enable signals that accompany each of the incoming write address and once-pipelined write address. In this approach, logic components 131 and 151, which may be AND gates, are included in memory circuit 100. Logic component 131 receives the output of comparator 130 and the once-pipelined write enable signal (stored in register 112) and performs a logical AND operation on the two signals. In effect, the output of comparator 130 is provided by gate 131 to gate 132 if the once-pipelined write enable signal is active. Similarly, logic component 151 receives the output of comparator 150 and the incoming write enable signal and performs a logical AND operation on the two signals. Thus, the output of comparator 150 is provided by gate 151 to both gate 132 and register 152 if the incoming write enable signal is active.

Figure 1C:
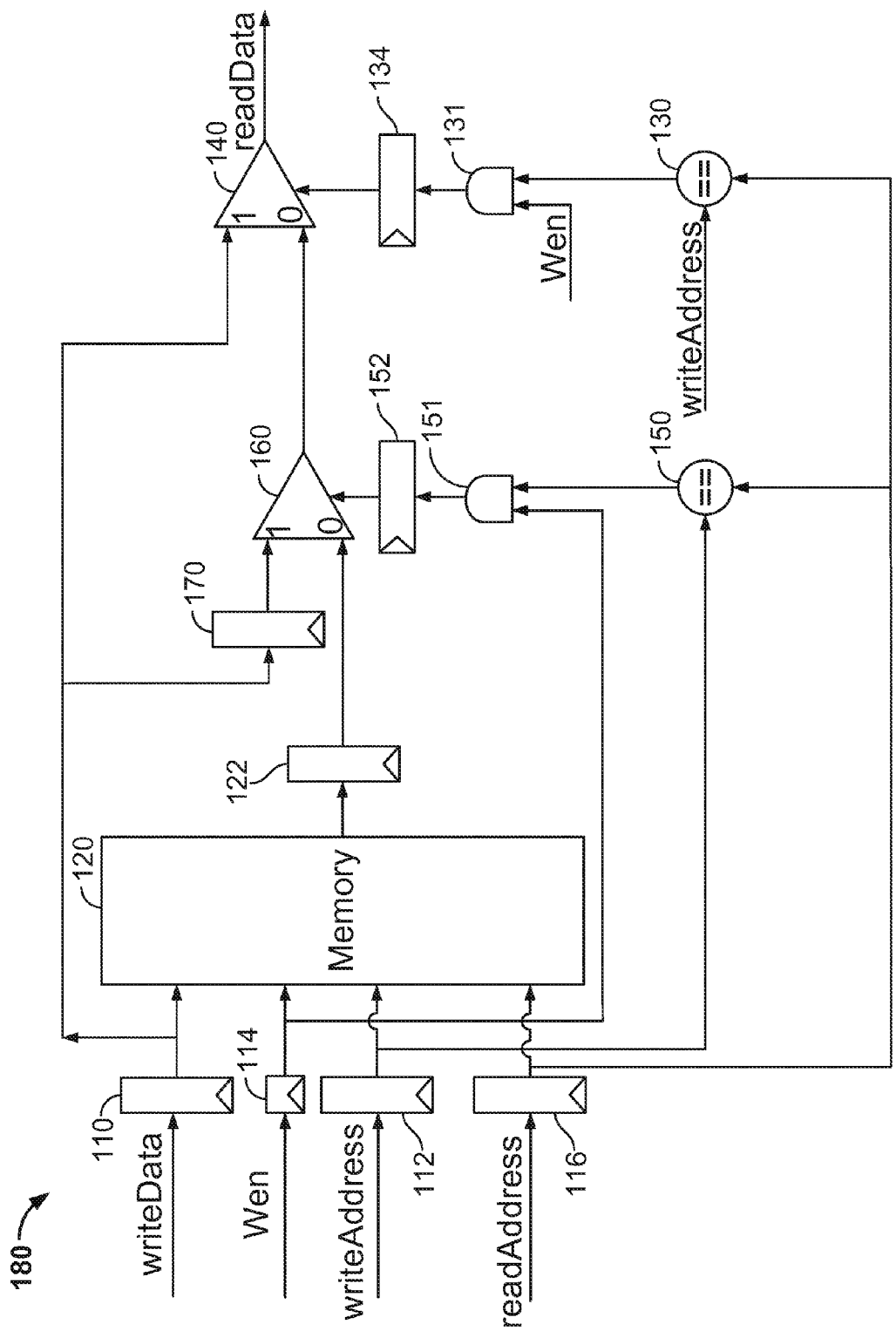

FIG. 1C shows another illustrative memory circuit 180 implementing coherent memory functionality, according to an illustrative embodiment. Compared with memory circuit 100 of FIG. 1B, memory circuit 180 has one fewer logic gate (e.g., there is no OR gate 132). In FIG. 1C, multiplexer 160 receives the output of register 170, as in FIGS. 1A and 1B, but also receives the output of register 122. Multiplexer 140, in turn, receives the output of multiplexer 160 and the output of register 110.

Comparator 130 outputs a signal indicating whether the incoming write address matches the once-delayed read address (provided by register 116). Logic gate 131 performs a logical AND operation on the output of comparator 130 and the incoming write enable signal, and outputs the result to register 134. Register 134 then provides the stored result to multiplexer 140 on the next clock cycle. In other words, multiplexer 140 receives a once-delayed indication of whether the incoming write address matches the once-delayed read address (provided by register 116) when the incoming write enable signal is active. Meanwhile, comparator 150 outputs a signal indicating whether the once-delayed write address (provided by register 112) matches the once-delayed read address (provided by register 116). Logic gate 151 performs a logical AND operation on the outputs of comparator 150 and register 114, which provides the once-delayed write enable signal, and outputs the result to register 152. Register 152 then provides the stored result to multiplexer 160. Thus, multiplexer 160 receives a once-delayed indication of whether the once-delayed write address (provided by register 112) matches the once-delayed read address (provided by register 116) when the once-delayed write enable signal (provided by register 114) is active.

Figure 1D:
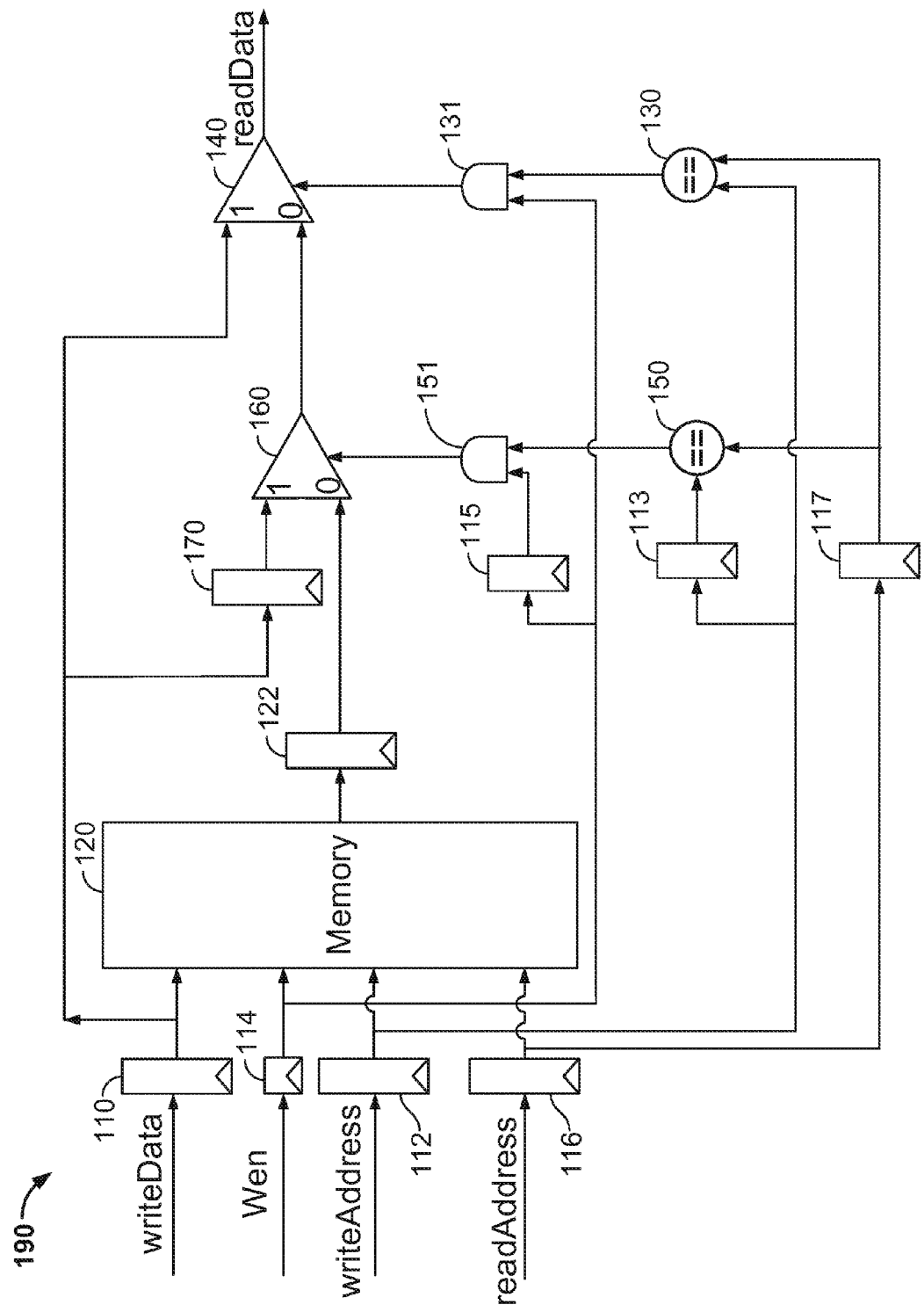

FIG. 1D shows another illustrative memory circuit 190 implementing coherent memory functionality, according to an illustrative embodiment. In particular, memory circuit 190 is similar to memory circuit 180 of FIG. 1C but retimed with the inclusion of an additional register. Registers 113, 115 and 117 store a once-delayed write address (received from register 112), a once-delayed write enable signal (received from register 114), and a once-delayed read address (received from register 116), respectively. These registers then provide, on the next clock cycle, a twice-delayed write address, a twice-delayed write enable signal, and a twice-delayed read address, respectively. Comparator 130 outputs a signal indicating whether the once-delayed write address (provided by register 112) matches the twice-delayed read address (provided by register 117). Logic gate 131 performs a logical AND operation on the outputs of comparator 130 and register 114, which provides the once-delayed write enable signal, and outputs the result to multiplexer 140. In other words, multiplexer 140 receives an indication of whether the once-delayed write address (provided by register 112) matches the twice-delayed read address (provided by register 117) when the once-delayed write enable signal (provided by register 114) is active. Meanwhile, comparator 150 outputs a signal indicating whether the twice-delayed write address (provided by register 113) matches the twice-delayed read address (provided by register 117). Logic gate 151 performs a logical AND operation on the outputs of comparator 150 and register 115, which provides the twice-delayed write enable signal, and provides the result to multiplexer 160. In other words, multiplexer 160 receives an indication of whether the twice-delayed write address (provided by register 113) matches the twice-delayed read address (provided by register 117) when the twice-delayed write enable signal (provided by register 115) is active.

Figure 2:
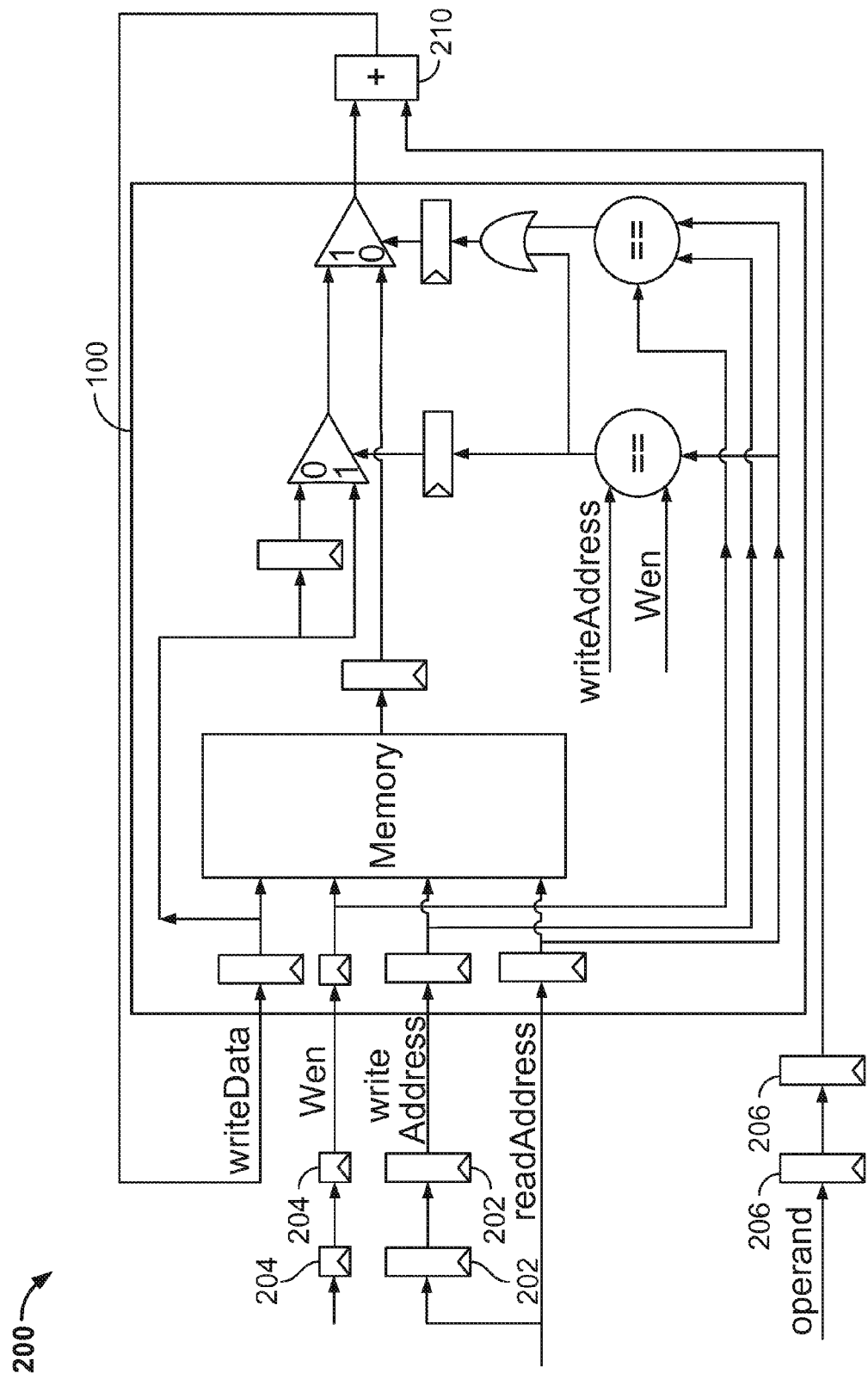
FIG. 2 is a block diagram of an illustrative circuit that uses coherent memory in an application that updates a memory location by adding a value to the currently stored value, according to an illustrative embodiment.

FIG. 2 shows illustrative circuit 200 that uses coherent memory 100 in an application that updates a memory location by adding a value to the currently stored value (e.g., a counter), according to an illustrative embodiment. Memory 100 is the embedded coherent memory circuit depicted in FIG. 1A (or the memory depicted in any of FIGS. 1B-1D). In some embodiments, memory circuit 100 is implemented as a dedicated "hard" logic circuit, while the circuit outside the box comprises user-programmable "soft" logic.

In order to update the correct value, the write address must be delayed (pipelined) by two cycles to allow the pipelined read to complete and the addition to be performed on the read data. The value added to the memory location must be similarly delayed by two clock cycles. A relatively simple user circuit may be designed and implemented to properly configure embedded memory 100: registers 202 pipeline the write address, registers 204 pipeline the write enable signal, and registers 206 pipeline the value to be added, all for two clock cycles. The loop through the memory requires only the adder 210 and the necessary routing to connect the memory inputs and outputs to adder 210. The ability to place the adder close to the memory, without the extra circuitry otherwise required to make the memory accesses coherent, allows for greatly improved performance over conventional approaches.

Figure 3:
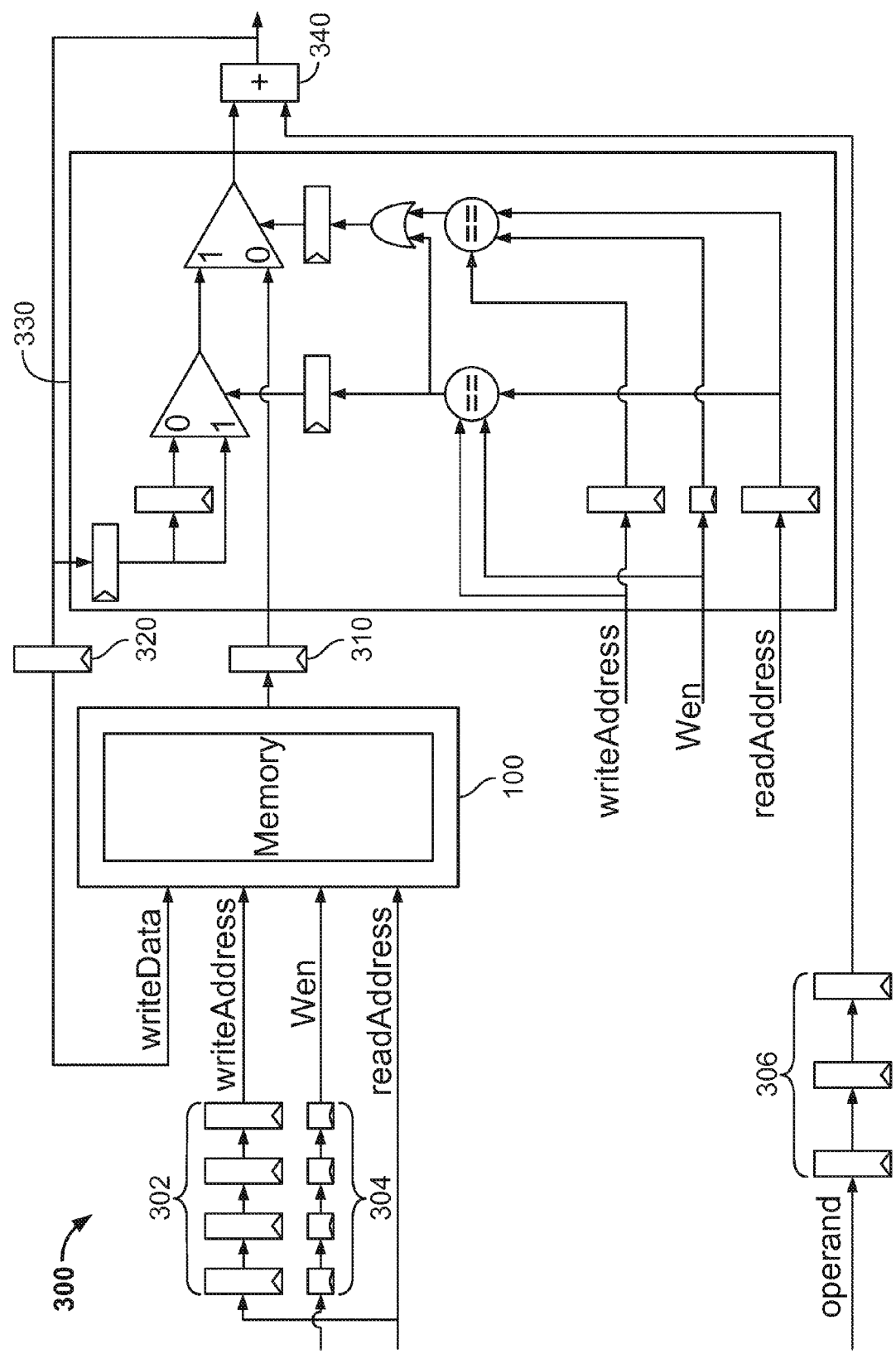
FIG. 3 is a block diagram of an illustrative circuit that augments coherent memory with additional external forwarding, according to an illustrative embodiment.

In some applications, the operation being performed is complex or the processing circuitry performing the operation must be placed further away from memory, e.g., due to design constraints. In these instances, further forwarding external to the memory may be employed to increase pipelining and thereby improve performance. FIG. 3 shows illustrative circuit 300 that uses coherent memory 100 and external forwarding in an application that updates a memory location by adding a value to the currently stored value (e.g., a counter), according to an illustrative embodiment. Memory 100 is the embedded coherent memory circuit depicted in any one of FIGS. 1A-1D. Circuit 300 includes an additional two levels of pipelining provided by registers 310 and 320. In particular, register 310 pipelines the read data while register 220 pipelines the write data. Since there are now four pipeline stages from the read to the write back of the new data, there are four balancing registers 302 on the write address input. In this arrangement, the adder circuit 340 may be located at a distance from the memory because the two registers 310 and 320 allow the routing between the memory and the adder to be pipelined. This may be desirable, for example, when multiple embedded memory blocks are combined into a single large memory.

The coherency mechanism described herein also simplifies implementation of "narrow memories." In some embodiments, FPGA embedded memories are configurable to allow a range of different data widths. For example, a memory may be configured to be as narrow 1 bit or as wide as 40 bits. However, certain memories may not allow such wide range of width options out of concern for cost or performance. Implementing narrow memories with wide memories may be achieved by allocating multiple logical memory locations to each physical memory location. Reading a narrow memory requires reading the appropriate physical memory location and then selecting the correct set of bits from this data, which adds only an extra level of multiplexing on the read output. However, writing to a narrow memory requires a read and a write to avoid changing the other logical memory locations allocated to the same physical memory location. Specifically, the appropriate physical memory location is read, the bits for the logical memory location are updated, and the resulting entire value is written back to the physical location. This read-modify-write operation requires coherent memory reads.

The coherency techniques and circuitry described above can be used to support narrow memories using read-modify-write, e.g., in cases where the physical memory cannot implement narrow modes. The circuitry that inserts the appropriate bits into the read data can be implemented either in soft logic or within the memory circuit using dedicated circuitry. For example, a physical memory with one write port and two read ports can be used to implement a dual port narrow memory. Write operations may use the write port along with one of the read ports, while read operations may use the second read port.

Figure 4:
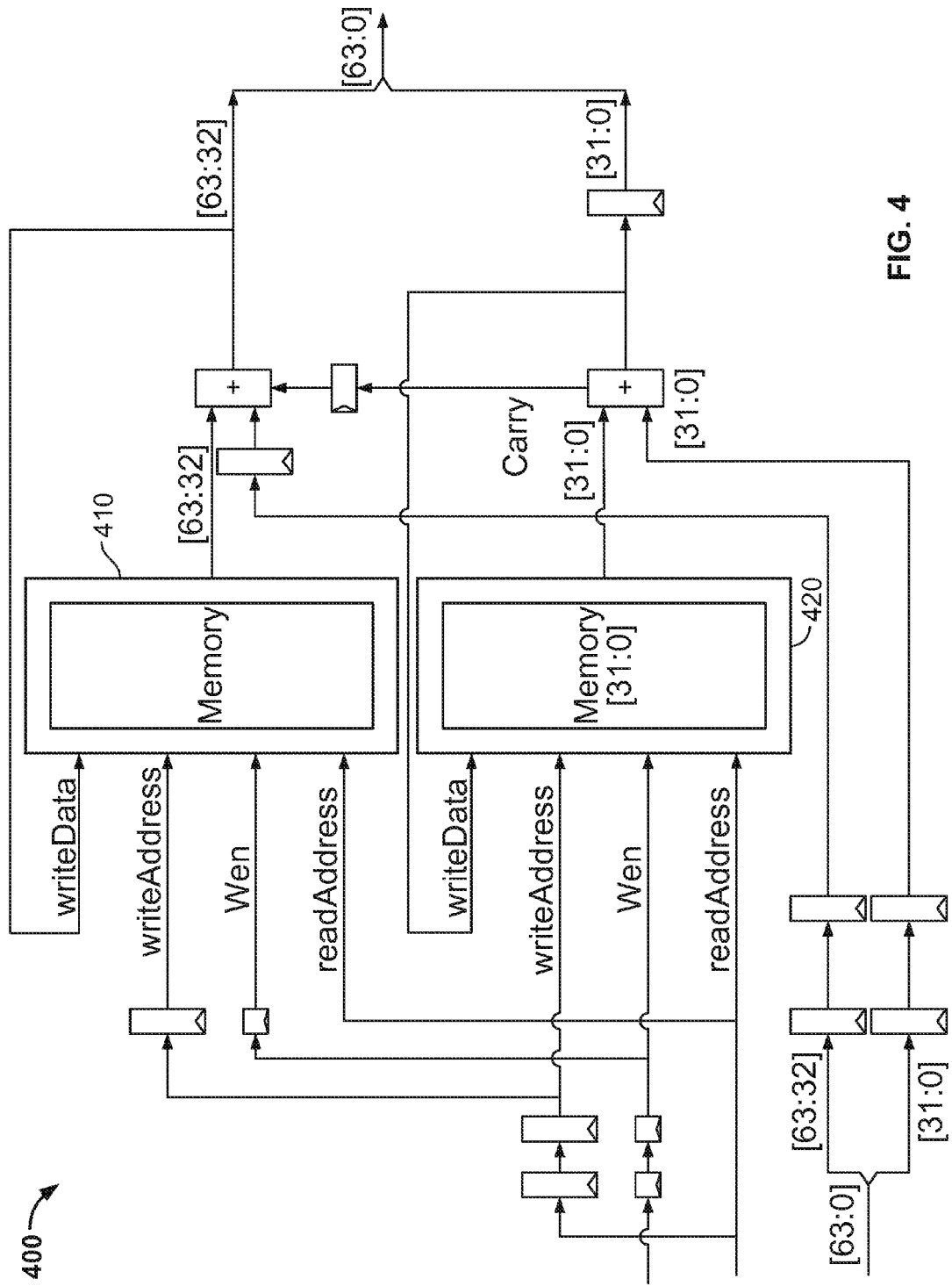
FIG. 4 is a block diagram of an illustrative circuit that combines coherent memory circuits to support 64-bit processing, according to an illustrative embodiment.

As noted above, in some embodiments, the coherent memory is self-contained and modular. In these embodiments, the coherent memory can support pipelining in a different dimension. For example, the coherent memory described herein can support 64-bit counters maintained in memory even when the embedded memory blocks are limited in width, e.g., to 32 or 40 bits. In particular, two or more memories may be combined in parallel to create a wide memory and, to reduce delay, the addition function can be pipelined. This pipelining is straightforward when using coherent memories as shown in FIG. 4. As shown, the lower memory 420 holds the low-order half of each memory location while the upper memory 410 holds the high-order half. The addition function is pipelined with the low-order bits added on the first clock cycle, and the second half on the second clock cycle. It should be understood that any feed-forward operation can be pipelined in conjunction with coherent memory to achieve any level of desired pipelining.

The coherency mechanism described above may also be used to ensure coherency for multi-ported memories. For example, FPGA embedded memories may provide multiple ports for reading and writing. To ensure multi-ported memories maintain coherency, forwarding paths may be added for the extra read ports to forward the relevant data from any write port. For the two-level pipelined memories described above in connection with FIG. 1A, this requires 2×R×W comparators and forwarding paths, where R is the number of read ports and W is the number of write ports. In general, N×R×W comparators and forwarding paths may be used to implement coherency for N-level pipelined memories with multiple ports.

Figure 5:
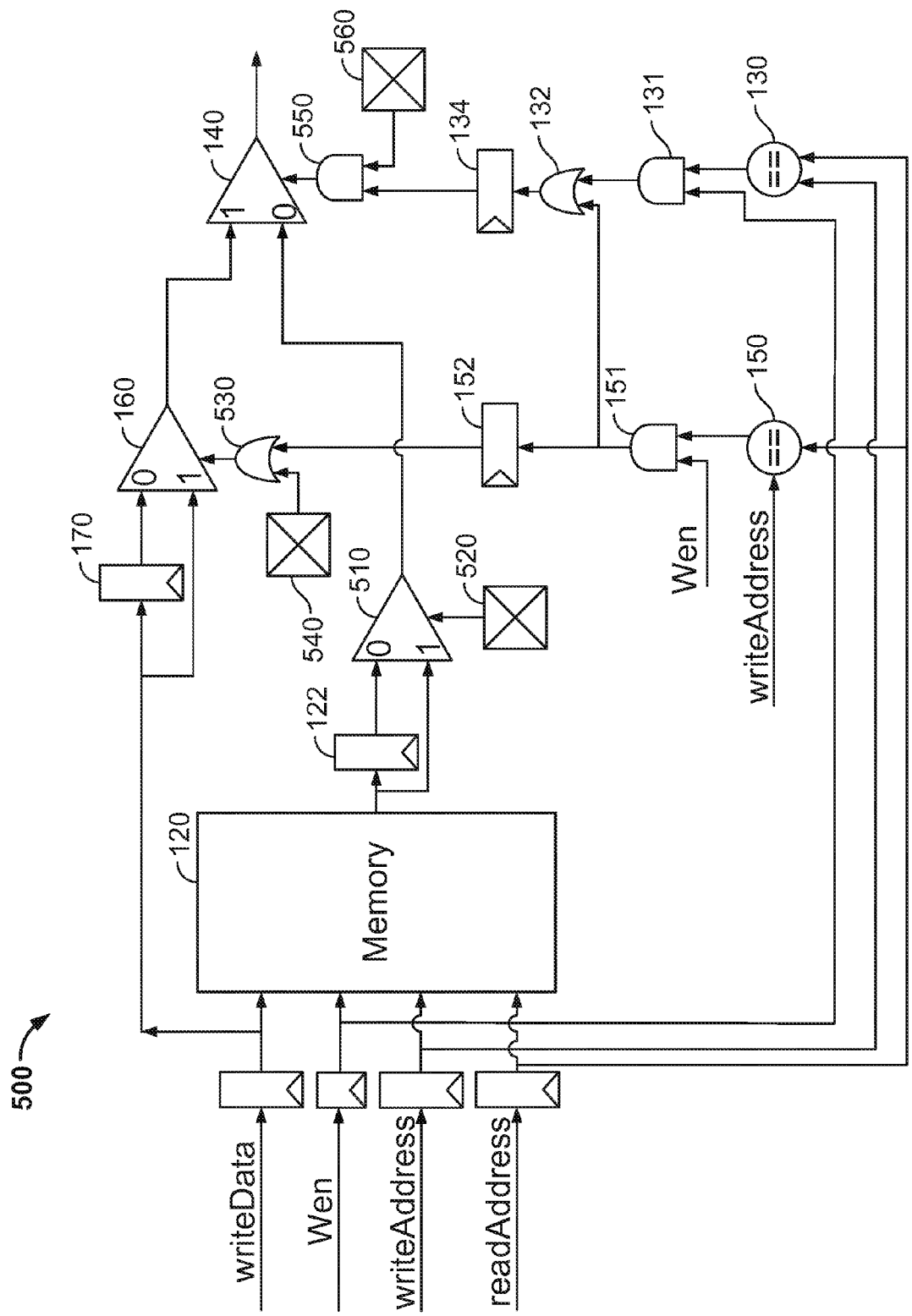
FIG. 5 is a block diagram of a memory circuit that includes user-configurable logic to control coherency and pipelining, according to an illustrative embodiment.

In some embodiments, the coherency circuit allows the user to specify whether coherency should be used and/or the level of pipelining employed. FIG. 5 shows illustrative memory circuit 500 that includes user-configurable logic to control coherency and pipelining, according to an illustrative embodiment. The configurable logic includes multiplexer 510, logic gates 530 and 550, and control bits 520, 540, and 560. These components control whether coherency is enabled, and if enabled, whether coherency is done for one or two levels of memory pipelining. Specifically, configurable control bit 520 along with multiplexer 510 determines whether or not the read data output from the memory is registered. Control bits 540 and 560 configure whether forwarding is enabled, and if so whether for one or two levels of pipelining. Forwarding is disabled if control bit 560 is set to 0, and the memory can be operated with one or two levels of pipelining as configured by control bit 520. If control bit 560 is set to 1 and control bit 540 is set to 1, then one level of forwarding is enabled and control bit 520 may be set to disable the second level of pipelining. If control bit 560 is set to 1 and control bit 540 is set to 0, then two levels of forwarding are enabled and control bit 520 may be set to enable the second level of pipelining.

The techniques described above can be extended to any number of K pipeline stages using a generalization of the forwarding circuit, described as the following combinational logic function:

$$\text{if } (WenN + K \text{ \&\& } WriteAddrN + K == ReadAddrN)$$
$$\text{then } ReadDataN = WriteDataN + K$$
$$\text{elseif } (WenN + K - 1 \text{ \&\& } WriteAddrN + K - 1 == ReadAddrN)$$
$$\text{then } ReadDataN = WriteDataN + K - 1$$
$$\ldots$$
$$\text{elseif } (WenN + 1 \text{ \&\& } WriteAddrN + 1 == ReadAddrN)$$
$$\text{then } ReadDataN = WriteDataN + 1$$
$$\text{else } ReadDataN = MemoryDataN$$

where N refers the number of the clock cycle of the read or write, clock cycle N+1 follows cycle N, and MemoryDataN is the data in memory during clock cycle N for the corresponding read ReadDataN. ReadDataN is the value returned by the memory system in clock cycle K for the address ReadAddrN (issued in clock cycle N).

Figure 6A:
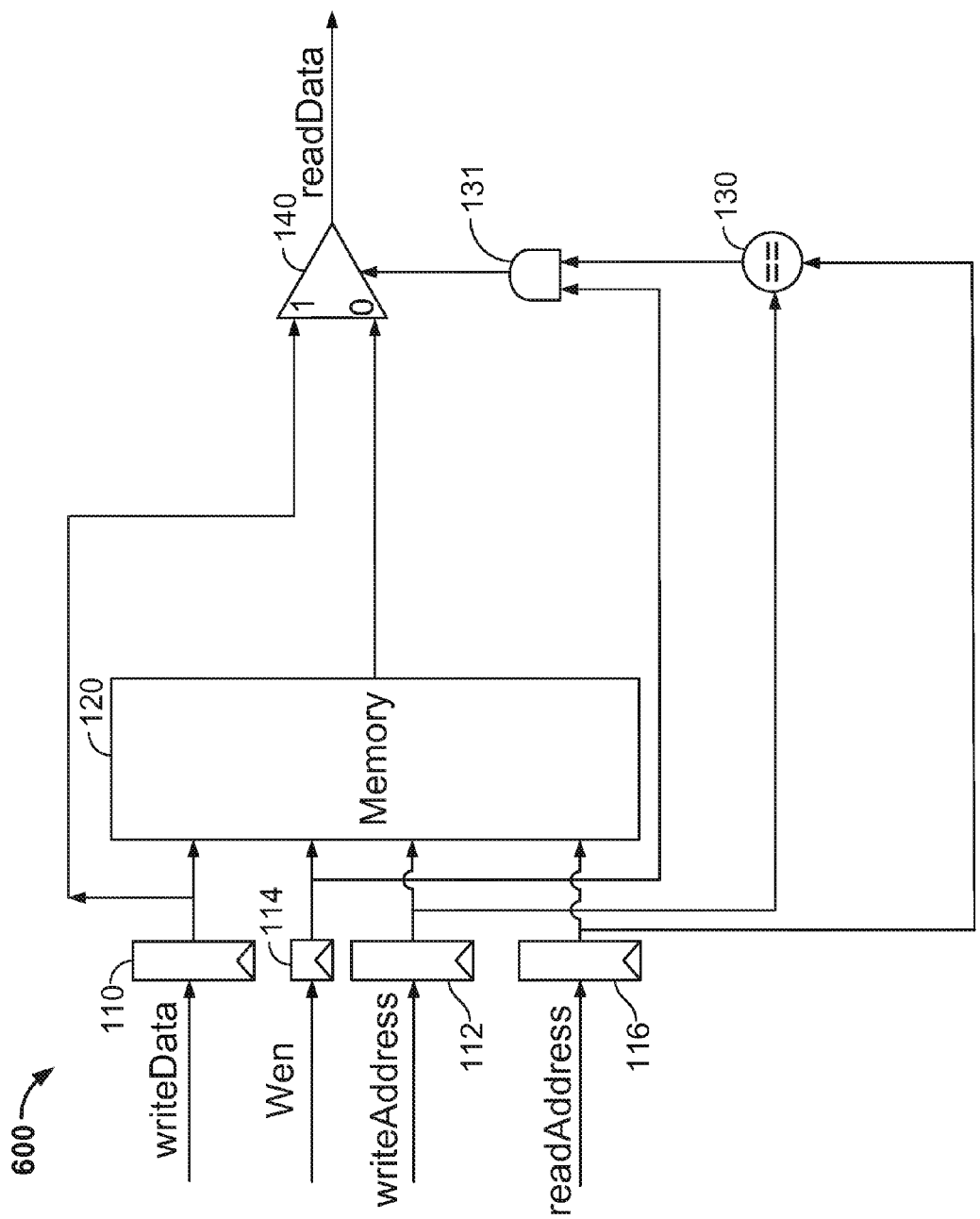
FIGS. 6A and 6B are block diagrams of a memory circuit with one and three levels of pipelining, respectively, according to illustrative embodiments.

For example, FIG. 6A shows illustrative circuit 600 implementing coherent memory functionality with one level of forwarding. In circuit 600, the memory output is provided directly to multiplexer 140, which also receives a once-delayed write data signal from register 110. Comparator 130 determines whether a once-delayed write address (provided by register 112) matches a once-delayed read address (provided by register 116) and provides the result of the comparison to logic component 131. Logic component 131 performs a logical AND operation on the signal provided by comparator 130 and a once-delayed write enable signal (provided by register 114) and provides the result of the operation to multiplexer 140 in order to control the selection of its output. That is, logic component 131 provides a signal indicating whether the once-delayed write address matches the once-delayed read address only when the corresponding once-delayed write enable signal is active. That signal, in turn, controls whether multiplexer 140 outputs the memory output or the once-delayed write data (provided by register 110). As shown, multiplexer 140 outputs the memory output when the addresses do not match and the once-delayed write data when they do match.

Figure 6B:
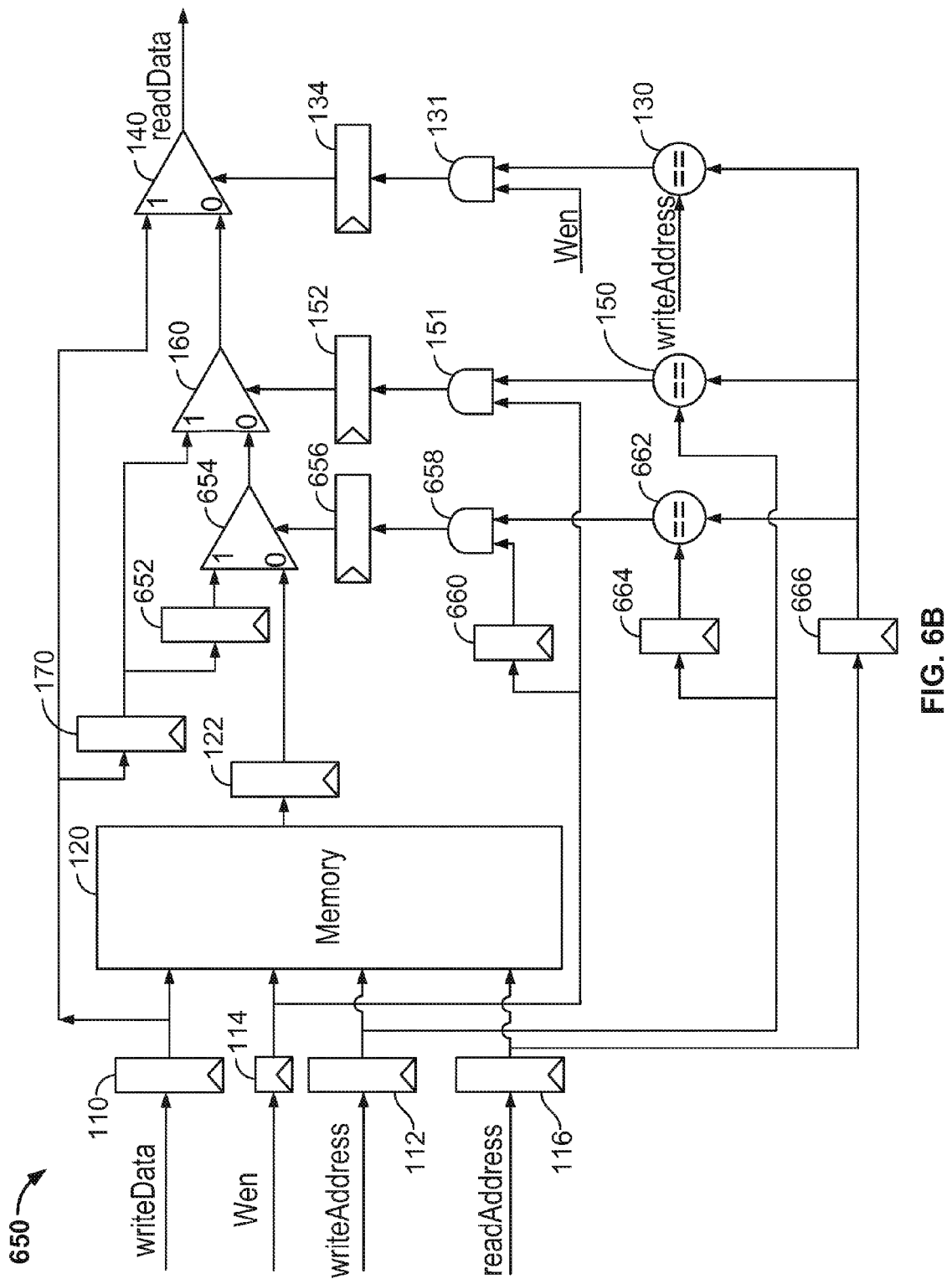

As another example, FIG. 6B shows illustrative circuit 650 implementing coherent memory functionality with three levels of forwarding. Circuit 600 is substantially similar to circuit 180 of FIG. 1C but includes another forwarding circuit. The additional forwarding circuit includes registers 652, 656, 660, 664 and 666; multiplexer 654; logic component 658, and comparator 662. Registers 652, 656, 660, 664, and 666 store, respectively, a twice-delayed write data signal from register 170, an output of the logical component 658, a once-delayed write enable signal from register 114, a once-delayed write address signal from register 112, and a once-delayed read address signal from register 116. Thus, on the next clock cycle, registers 652, 656, 660, 664, and 666 provide, respectively, a thrice-delayed write data signal, a once-delayed output of the logical component 658, a twice-delayed write enable signal, a twice-delayed write address signal, and a twice-delayed read address signal.

Comparator 662 determines whether the twice-delayed write address matches (provided by register 664) the twice-delayed read address (provided by register 666) and outputs the result to logic component 658. Logic component 658 performs a logical AND operation on the output of comparator 662 and the twice-delayed write enable signal (provided by register 660) and outputs the result to register 656. Accordingly, register 656 stores a signal indicating whether the twice-delayed write address and twice-delayed read address match and the corresponding twice-delayed write enable signal is active. This signal is used on the next clock cycle, to select the output of multiplexer 654. The thrice-delayed write data (provided by register 652) is output when the addresses match and the write enable signal is active; otherwise, the once-delayed memory output (from register 122) is provided.

Figure 8:
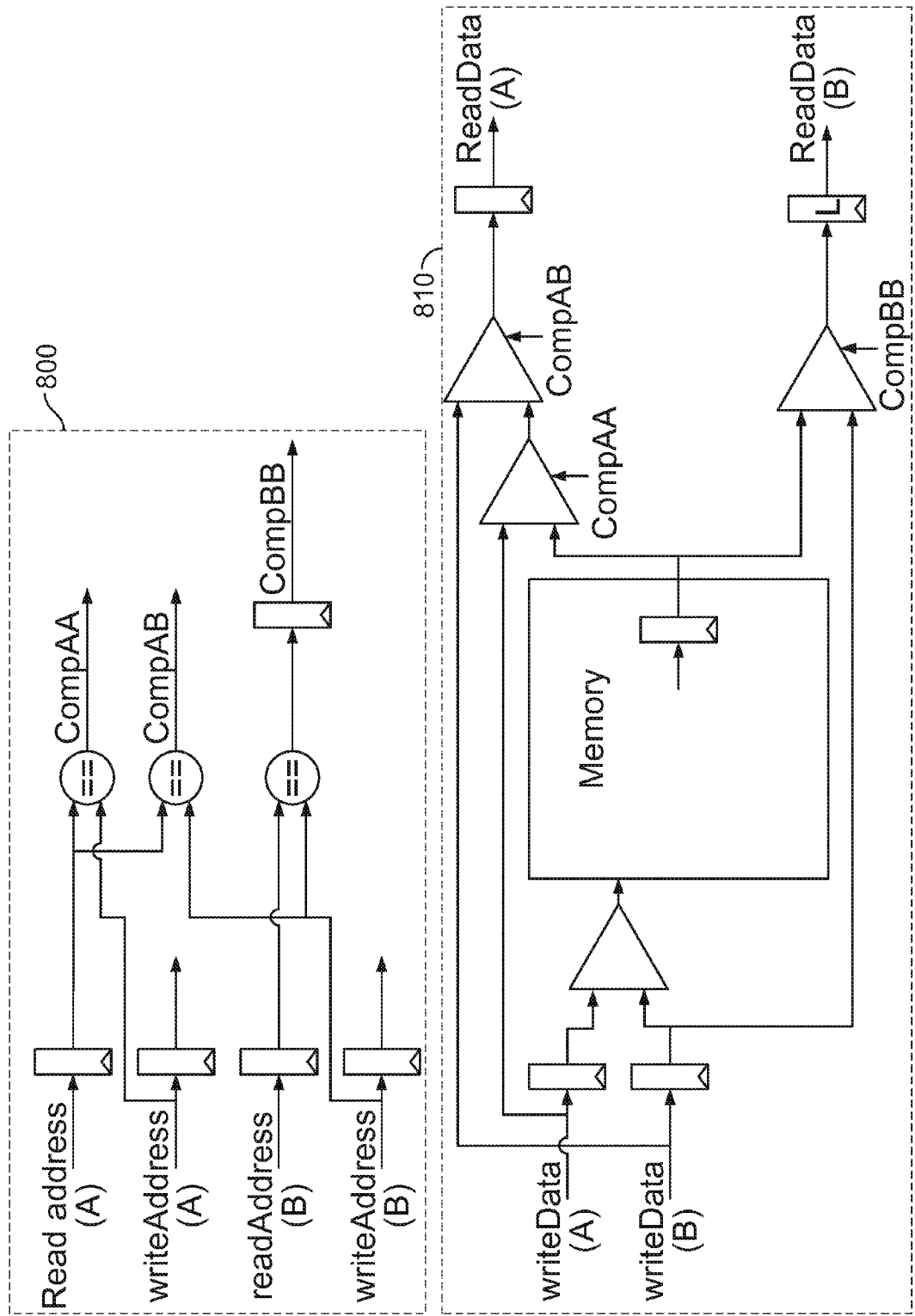
FIG. 8 is a block diagram of coherent memory implemented using a coherent 2-port memory and additional forwarding logic to implement full coherency, according to an illustrative embodiment.

Software tools may be provided to users to design circuits using the coherent memory circuits described above. These tools may, among other functions, allow users to: stitch multiple embedded memory blocks to include coherency; use read-modify-write operations along with coherent memory to implement narrow memories; implement multiple ports by time-multiplexing memories with coherency support, and combine soft logic to implement the additional required forwarding; add extra levels of forwarding to create large coherent memories from coherent embedded memory blocks; implement read-modify-write operations as part of the memory definition; and create coherent multi-ported memories from simple dual-ported memories using time-multiplexing and additional soft logic to implement the additional forwarding paths, as depicted in FIG. 8. FIG. 8 is a block diagram of coherent memory implemented using a coherent 2-port memory and additional forwarding logic to implement full coherency, according to an illustrative embodiment. Although not shown, it should be understood that logic circuitry may be added to the depicted forwarding logic (blocks 800 and 810) to account for write enable signals as described herein. That is, when a write enable signal is required by the memory, signals CompAA, CompAB, and CompBB may only be asserted if the corresponding write enable signals are also asserted.

Figure 9:
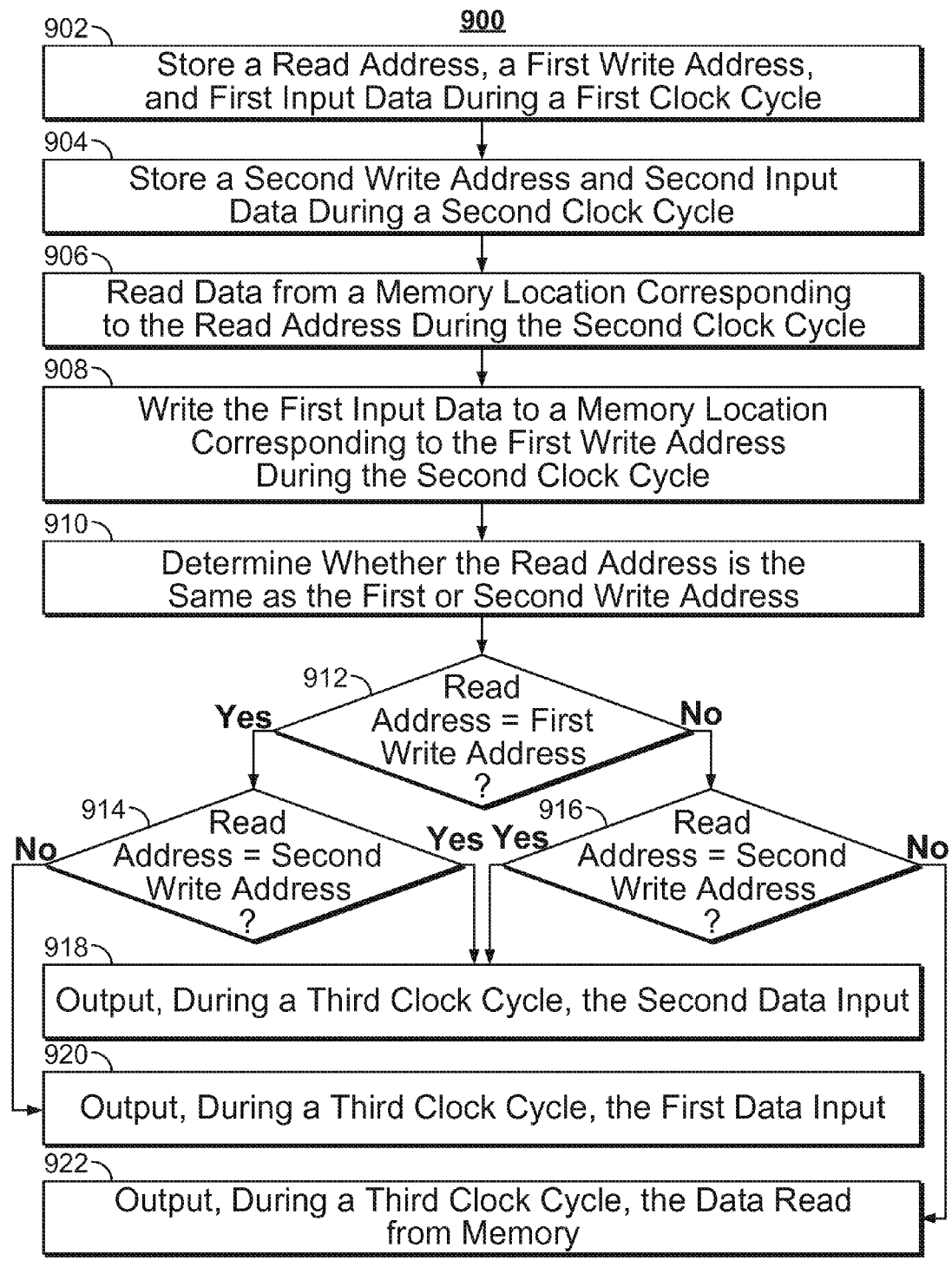
FIG. 9 is a flowchart showing a process for maintaining memory access coherency, according to an illustrative embodiment.

FIG. 9 is a flowchart showing an illustrative process 900 for maintaining memory access coherency, in accordance with some embodiments. Process 900 may be implemented in hardware (e.g., as discrete circuitry and/or as part of an ASIC or FPGA), software (e.g., as computer-executable instructions stored on a non-transitory computer-readable medium), or a combination thereof. At step 902, the process stores a read address, a first write address, and first input data during a first clock cycle. For example, the read address, the first write address, and the first input data may be stored in registers 116, 112, and 110 of FIGS. 1A-1D, as described above. If a write enable signal is required by the memory, process 900 also stores a first write enable signal corresponding to the first input data (e.g., in register 114). Next, at step 904, the process additionally stores a second write address and second input data during a second clock cycle (and, optionally, a second write enable signal corresponding to the second input data). During the second clock cycle, the process also reads data from a memory location (e.g., of memory 120) corresponding to the read address (step 906) and writes the first input data to a memory location corresponding to the first write address (step 908).

At step 910, the process determines whether the read address is the same as the first or second write address. When a write enable signal is required by the memory, process 900 also determines whether the first and second write enable signals are asserted. If the read address matches the first write address (and, optionally, the first write enable signal is asserted), the process proceeds to step 914, otherwise the process proceeds to step 916. At step 914, if the read address further matches the second write address (and, optionally, the second write enable signal is asserted), the process proceeds to step 918 where it outputs the second data input during a third clock cycle. Otherwise, if the read address does not match the second write address (or, optionally, the second write enable signal is not asserted), the process proceeds to step 920 and outputs the first data input during the third clock cycle. At step 916, if the read address matches the second write address (and, optionally, the second write enable signal is asserted), the process likewise proceeds to step 918 where it outputs the second data input during a third clock cycle. On the other hand, if the read address does not match the second write address (or, optionally, the second write enable signal is not asserted), the process proceeds to step 922 and outputs the data read from memory during the third clock cycle.

Figure 10:
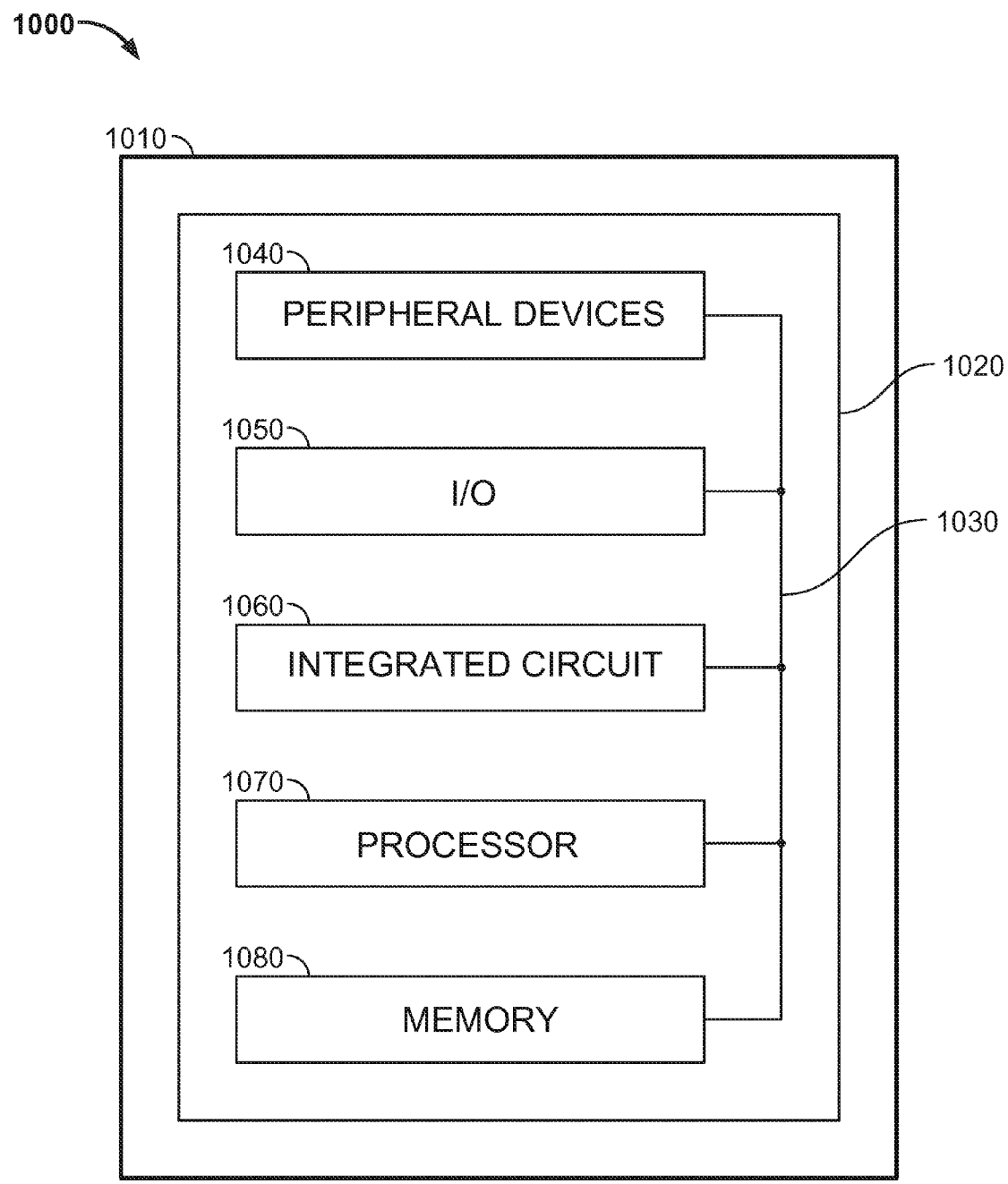
FIG. 10 shows an illustrative system that may be used to implement some embodiments of the present disclosure.

FIG. 10 shows an illustrative system that may be used to implement some embodiments of the present disclosure. System 1000 may be or may include a circuit or other device (e.g., processing block, programmable integrated circuit, ASSP, ASIC, PLD, full-custom chip, dedicated chip). System 1000 can include one or more of the following components: a processor 1070, memory 1080, I/O circuitry 1050, a circuit 1060, and peripheral devices 1040. Circuit 1060 may be a programmable integrated circuit device, such as an ASSP, an ASIC, a PLD, or any other suitable programmable integrated circuit device. Memory 1080 may contain one or more memory circuits similar in form and function to memory circuits 100, 180, 190, 500, 600, and/or 650 described herein. These components are connected together by a system bus or other interconnections 1030 and are populated on a circuit board 1020 which is contained in an end-user system 1010.

System 1000 may be used in a wide variety of applications, such as computer networking, data networking, instrumentation, video processing, digital signal processing, or any other application where the advantage of using programmable or reprogrammable logic is desirable. Circuit 1060 may be used to perform a variety of different logic functions and/or calculate a variety of different mathematical functions. For example, circuit 1060 may be configured as a controller or group of processing blocks that work in cooperation with processor 1070. Circuit 1060 may also be used to perform signal processing. In yet another example, circuit 1060 may be configured as an interface between processor 1070 and one of the other components in system 1000. It should be noted that system 1000 is only exemplary, and that the true scope and spirit of the embodiments should be indicated by the following claims.

The foregoing is merely illustrative of the principles of the embodiments and various modifications can be made by those skilled in the art without departing from the scope and spirit of the embodiments disclosed herein. The above described embodiments of the present disclosure are presented for purposes of illustration and not of limitation, and the present disclosure is limited only by the claims which follow.

What is claimed is:

1. A memory circuit for maintaining memory access coherency, the memory circuit comprising:
   a plurality of registers configured to:
      store a read address, a first write address, and first input data during a first clock cycle; and
      store a second write address and second input data during a second clock cycle;
   a memory configured to:
      read data from a memory location corresponding to the read address during the second clock cycle, wherein the plurality of registers are further configured to store the data read from memory; and
      write the first input data at a memory location corresponding to the first write address during the second clock cycle;
   comparator circuitry comprising N×R×W comparators and forwarding paths, wherein N is an integer corresponding to a level of pipelining, R is an integer corresponding to a number of read ports of the memory, and W is an integer corresponding to a number of write ports of the memory, wherein the comparator circuitry is configured to determine whether the read address is the same as the first write address or the second write address; and
   selection circuitry configured to output, during a third clock cycle:
      the second data input when the comparator circuitry determines that the read address is the same as the second write address;

the first data input when the comparator circuitry determines that the read address is the same as the first write address but not the second write address; and the data read from memory when the comparator circuitry determines that the read address is not the same as the first write address or the second write address.

2. The memory circuit of claim 1, wherein the plurality of registers comprises a first register, a second register, a third register, a fourth register, and a fifth register;
the first register configured to:
store the first input data during the first clock cycle and the second input data during the second clock cycle;
provide, during the second clock cycle, the first input data to each of the memory, the fourth register, and the selection circuitry; and
provide, during the third clock cycle, the second input data to each of the memory and the selection circuitry;
the second register configured to:
store the first write address during the first clock cycle and the second write address during the second clock cycle;
provide, during the second clock cycle, the first write address to each of the memory and the comparator circuitry; and
provide, during the third clock cycle, the second write address to the memory;
the third register configured to:
store the read address during the first clock cycle; and
provide, during the second clock cycle, the read address to each of the memory and the comparator circuitry;
the fourth register configured to:
store the first input data during the second clock cycle; and
provide, during the third clock cycle, the first input data to the selection circuitry; and
the fifth register configured to:
store the data read from memory during the second clock cycle; and
provide, during the third clock cycle, the data read from memory to the selection circuitry.

3. The memory circuit of claim 2, wherein the plurality of registers further comprises:
a sixth register configured to:
store, during the second clock cycle, a first indication whether the read address is the same as the first write address or the second write address; and
provide, during the third clock cycle, the first indication to the selection circuitry; and
a seventh register configured to:
store, during the second clock cycle, a second indication whether the read address is the same as the second write address; and
provide, during the third clock cycle, the second indication to the selection circuitry.

4. The memory circuit of claim 3, wherein the plurality of registers further comprises an eighth register configured to:
store a first write enable signal during the first clock cycle and a second write enable signal during the second clock cycle; and
provide, during the second clock cycle, the first write enable signal to each of the memory and the comparator circuitry;

wherein the memory is further configured to write the first input data to the memory location corresponding to the first write address only when the first write enable signal is active; and
wherein the comparator circuitry is further configured to determine whether the read address is the same as the first write address or the second write address based on the first write enable signal and the second write enable signal.

5. The memory circuit of claim 3, wherein the comparator circuitry comprises:
a first comparator configured to generate, during the second clock cycle, a third indication whether the read address is the same as the first write address; and
a second comparator configured to generate, during the second clock cycle, the second indication whether the read address is the same as the second write address; and
a logic gate configured to:
receive the second indication and the third indication; and
generate, during the second clock cycle, the first indication whether the read address is the same as the first write address or the second write address.

6. The memory circuit of claim 5, wherein the selection circuitry comprises:
a first multiplexer configured to:
receive, during the third clock cycle, the first input data, the second input data, and the second indication; and
output, during the third clock cycle:
the first input data when the second indication indicates the read address is not the same as the second write address; and
the second input data when the second indication indicates the read address is the same as the second write address; and
a second multiplexer configured to:
receive, during the third clock cycle, the data read from memory, the output of the first multiplexer, and the first indication; and
output, during the third clock cycle:
the data read from memory when the first indication indicates the read address is not the same as the first write address or the second write address; and
the output of the first multiplexer when the first indication indicates the read address is the same as the first write address or the second write address.

7. The memory circuit of claim 1, wherein the plurality of registers, the memory, the comparator circuitry, and the selection circuitry are all implemented in dedicated hard logic of a programmable logic device.

8. The memory circuit of claim 1, wherein:
the comparator circuitry is further configured to determine whether coherency is enabled and whether coherency is enabled for one or two levels of pipelining; and
the selection circuitry is configured to output, during the third clock cycle, one of the second data input, the first data input, and the data read from memory, wherein:
the second data input is output when the comparator circuitry determines coherency is enabled for two levels of pipelining and the read address is the same as the second write address; and
the first data input is output when the comparator circuitry determines (i) coherency is enabled for two levels of pipelining and the read address is the same as the first write address but not the second write address, or (ii) coherency is enabled for one level of pipelining and the read address is the same as the first write address.

9. The memory circuit of claim 8, wherein the comparator circuitry comprises:
a first comparator configured to generate, during the second clock cycle, a first indication whether the read address is the same as the first write address;
a second comparator configured to generate, during the second clock cycle, a second indication whether the read address is the same as the second write address;
a first logic gate configured to perform a logical OR operation on the first indication and the second indication to generate, during the second clock cycle, a third indication indicating whether the read address is the same as either the first write address or the second write address;
a second logic gate configured to perform a logical AND operation on the third indication and a first configuration signal indicating whether coherency is enabled; and
a third logic gate configured to perform a logical AND operation on the second indication and a second configuration signal indicating whether coherency is enabled for one or two levels of pipelining.

10. The memory circuit of claim 9, wherein the selection circuitry comprises a multiplexer configured to:
receive the data read from memory during both the second clock cycle and the third clock cycle;
receive a third configuration signal indicating whether to pipeline memory output; and
output the data read from memory during one of the second clock cycle and the third clock cycle based on the third configuration signal.

11. The memory circuit of claim 10 further comprising configurable logic configured to generate the first, second, and third configuration signals based on user settings.

12. The memory circuit of claim 1, wherein the selection circuitry is configured to receive the data read from memory, the first data input, and the second data input prior to outputting the second data input, the first data input, or the data read from memory.

13. A system comprising a memory circuit for maintaining memory access coherency, the memory circuit comprising:
a pipeline register coupled to an input data register and configured to store an output of the input data register;
a first multiplexer coupled to the input data register and the pipeline register;
a second multiplexer coupled to the first multiplexer and a memory output register;
a first comparator coupled to a read address register and configured to compare an output of the read address register to an incoming write address; and
a second comparator coupled to the read address register and a write address register and configured to compare the output of the read address register to an output of the write address register;
wherein the first multiplexer is configured to provide one of the output of the input data register and an output of the pipeline register based on an output of the first comparator; and
wherein the second multiplexer is configured to provide one of an output of the memory output register and an output of the first multiplexer based on outputs of the first comparator and the second comparator.

14. The system of claim 13, wherein the memory circuit further comprises:
a first comparator register coupled to the first comparator and configured to store the output of the first comparator; and
a second comparator register coupled to the second comparator and configured to store the output of the second comparator.

15. The system of claim 14, wherein the memory circuit further comprises:
a memory coupled to the input data register, the write address register, the read address register, and the memory output register;
wherein the memory is configured to store the output of the input data register at a memory location specified by the output of the write address register, and to output data read from a memory location specified by the output of the read address to the memory output register.

16. The system of claim 15 further comprising:
a plurality of input pipeline registers coupled to the write address register and configured to pipeline an input of the read address register; and
processing circuitry coupled to the memory circuit and configured to process an output of the second multiplexer;
wherein the input data register is configured to receive an output of the processing circuitry.

17. The system of claim 16, wherein the plurality of input pipeline registers is configured to pipeline the input of the read address register for two clock cycles.

18. The system of claim 16 further comprising:
forwarding circuitry coupled to the processing circuitry; and
a plurality of output pipeline registers configured to:
store the output of the second multiplexer and the output of the processing circuitry;
provide the output of the second multiplexer to the forwarding circuitry; and
provide the output of the processing circuitry to the input data register;
wherein the forwarding circuitry is configured to provide, during any given clock cycle, one of the stored output of the second multiplexer, the stored output of the processing circuitry, and once-delayed stored output of the processing circuitry to the processing circuitry based on outputs of one or more additional comparators.

19. The system of claim 16, wherein the memory circuit is implemented in hard logic of a programmable logic device, and wherein the plurality of input pipeline registers and the processing circuitry are implemented in soft logic of the programmable logic device.

20. A method for maintaining memory access coherency, the method comprising:
providing N×R×W comparators and forwarding paths, wherein N is an integer corresponding to a level of pipelining, R is an integer corresponding to a number of read ports of memory, and W is an integer corresponding to a number of write ports of the memory;
storing a read address, a first write address, and first input data during a first clock cycle;
storing a second write address and second input data during a second clock cycle;
reading data from a memory at a memory location corresponding to the read address during the second clock cycle;

writing the first input data at a memory location corresponding to the first write address during the second clock cycle;
determining whether the read address is the same as the first write address or the second write address using comparator circuitry; and
outputting, during a third clock cycle:
- the second data input when the read address is the same as the second write address;
- the first data input when the read address is the same as the first write address but not the second write address; and
- the data read from memory when the read address is not the same as the first write address or the second write address.

21. The method of claim 20 further comprising:
allocating multiple logical memory locations to each physical memory location of the memory;
receiving a request to write to a given logical memory location;
mapping the given logical memory location to its corresponding physical memory location, wherein the read address is the mapped physical memory location;
determining that the read address is the same as the second write address and outputting the second data input;
modifying bits of the second data input corresponding to the given logical memory location; and
writing the modified second data input to memory, wherein the write address is the mapped physical memory location.

22. The method of claim 20, wherein N is a user-configurable value.

* * * * *